(12) United States Patent
Poplevine et al.

(10) Patent No.: US 6,711,051 B1
(45) Date of Patent: Mar. 23, 2004

(54) STATIC RAM ARCHITECTURE WITH BIT LINE PARTITIONING

(75) Inventors: Pavel Poplevine, Foster City, CA (US); Annie-Li-Keow Lum, Milpitas, CA (US); Weipeng Zhang, San Francisco, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 5 days.

(21) Appl. No.: 10/235,530

(22) Filed: Sep. 5, 2002

(51) Int. Cl.[7] .............................................. G11C 11/00
(52) U.S. Cl. .................. 365/154; 365/203; 365/189.02
(58) Field of Search ................................. 365/154, 203, 365/189.02, 189.01, 207

(56) References Cited

U.S. PATENT DOCUMENTS

| | | | |
|---|---|---|---|
| 4,300,212 A | 11/1981 | Simko | 365/185 |
| 4,400,799 A | 8/1983 | Gudger | 365/95 |
| 4,408,303 A | 10/1983 | Guterman et al. | 365/205 |
| 4,541,076 A | 9/1985 | Bowers et al. | 365/190 |
| 4,580,245 A | 4/1986 | Ziegler et al. | 365/154 |
| 4,772,930 A | 9/1988 | Anami et al. | 357/42 |
| 4,912,471 A | 3/1990 | Tyburski et al. | 342/42 |
| 4,935,734 A | 6/1990 | Austin | 340/825.83 |
| 5,307,352 A | 4/1994 | Moench | 370/112 |
| 5,365,123 A | 11/1994 | Nakase et al. | 326/109 |
| 5,644,155 A | 7/1997 | Lien | 257/401 |
| 5,724,292 A | * 3/1998 | Wada | 365/207 |
| 5,845,322 A | 12/1998 | Leung | 711/151 |
| 5,903,137 A | 5/1999 | Freiman et al. | 320/163 |
| 5,909,222 A | 6/1999 | Umeshima | 345/437 |
| 6,260,097 B1 | 7/2001 | Farmwald et al. | 710/129 |

* cited by examiner

*Primary Examiner*—David Lam
(74) *Attorney, Agent, or Firm*—Stallman & Pollock LLP

(57) ABSTRACT

A SRAM system which provides for reduced power consumption. The SRAM system utilizes an array of bit cells. Columns of bit cells in the array are partitioned into sections. Each section of bit cells shares a local bit line. A sector select circuit provides for precharging the local bit lines. The sector select circuit also includes a mux for connecting a local bit line to a global bit line. The sector select circuit includes a device for detecting when a sector select signal and a column select signal are present. When both of these signals are present the sector select circuit couples the local bit line with the global bit line, and disengages the precharging of the local bit line.

18 Claims, 13 Drawing Sheets

| FIG. 3a | FIG. 3b |
|---|---|
| FIG. 3c | FIG. 3d |

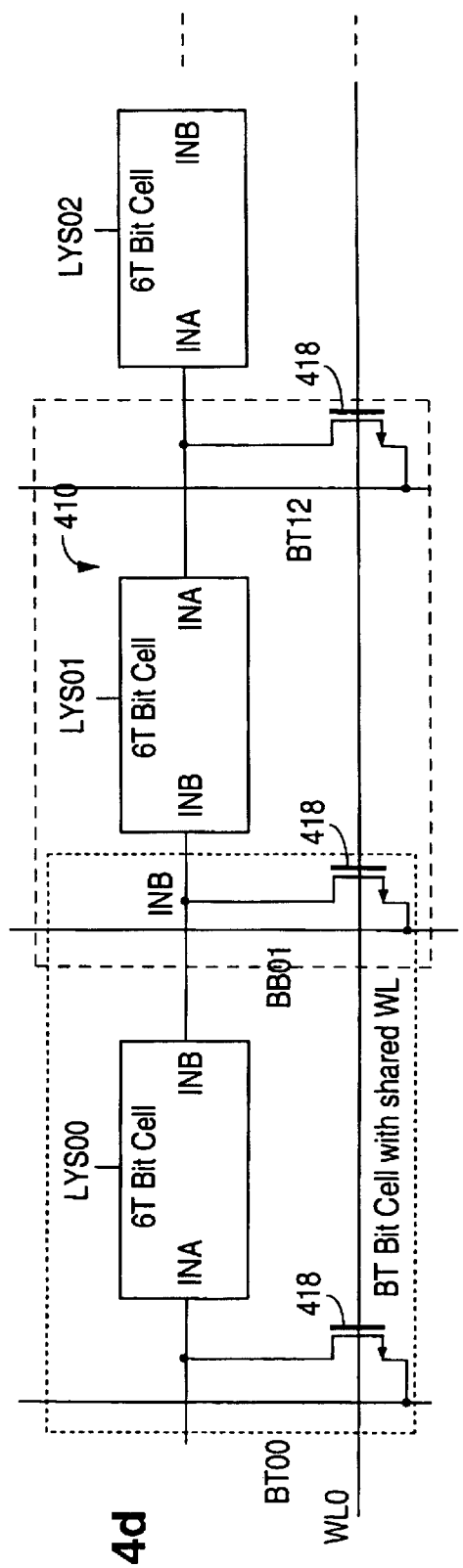
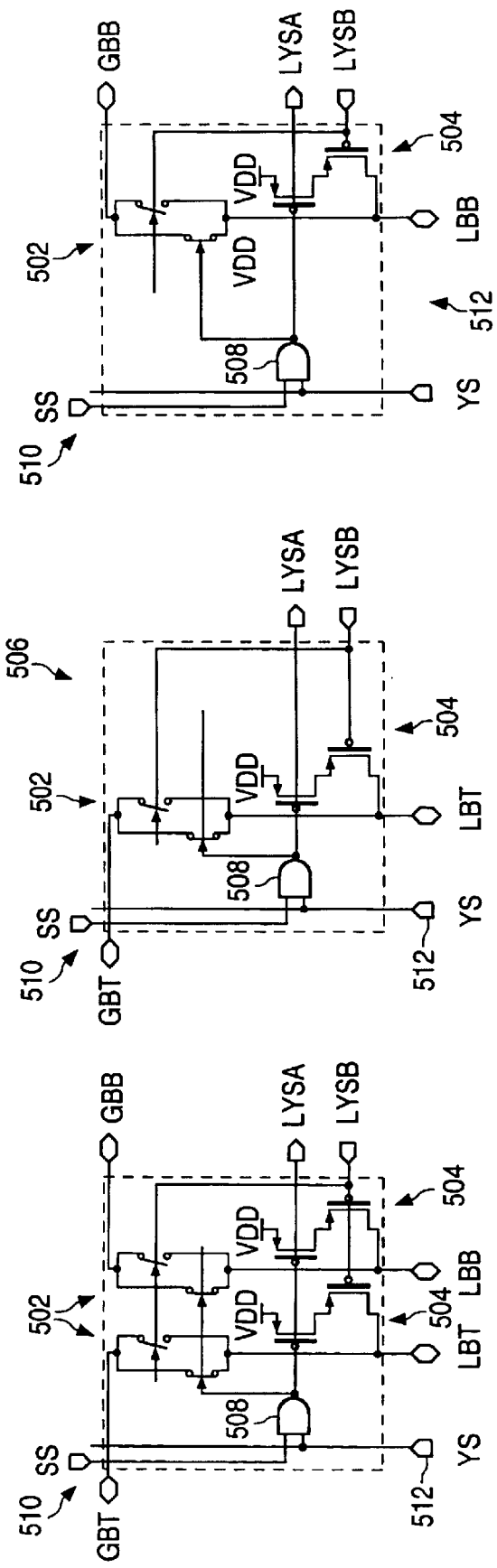
FIG. 4d
FIG. 5a
FIG. 5b
FIG. 5c

STATIC RAM ARCHITECTURE WITH BIT LINE PARTITIONING

TECHNICAL FIELD

The present invention relates to the field of static random access memory (SRAM) arrays, and to a SRAM memory architecture providing for bit line partitioning.

BACKGROUND OF THE INVENTION

FIG. 1 shows a SRAM memory array architecture of the prior art. This architecture utilizes a six transistor memory cell 200 as shown in FIG. 2. The six transistor SRAM bit cell 200 shown in FIG. 2 utilizes a first supply voltage, VDD 217, and a ground connection 218. The cell also includes a word line WLC. Bit lines BTC and BBC provide a connection to read and write data to the cell. The bit cell also includes a storage cell which includes four transistors, 206, 208, 210, 212, configured to store data. As is known in the art, transistors 206 and 208 act as load transistors and transistors 210 and 212 act as cross coupled storage transistors. As shown in the bit cell 200, the load transistors 206 and 208 are PMOS transistors, and storage transistors 210 and 212 are NMOS transistors. NMOS Transistors 214 and 216 are word line, or row select, pass transistors.

In a static mode, when the cells in the memory array are not in write or read mode, bit lines BTC and BBC, shown in FIG. 2, are precharged to a VDD level, and the word line shown in FIG. 2 as WLC is at logic zero. In this static state, a programmed cell can maintain the information equivalent to logic 0 or logic 1, since n-channel devices 214 and 216 are off, which isolates the storage cell that includes devices 206, 208, 210 and 212.

In a write mode, the WLC line (e.g. WL0, WL1 ... WLN) which is coupled to a row of cells (e.g. N00, N01 ... N0M), as shown in FIG. 1, which contains the cell being written to, is driven to logic 1 or VDD to turn on (open) the pass transistors, thereby providing access to the storage cell. To write to the cell to be programmed to store a binary 1, the bit line BTC for the cell being written to is driven to logic 1, and the bit line BBC is driven to logic 0. This results in the cell being programmed to logic 1, where the voltage at node 202 will be set at logic 1 and the voltage at node 204 will be set at logic 0 as is known in the art. To program the cell to logic 0 the bit line BTC is driven to logic 0 and the bit line BBC is driven to logic 1, such that 202 will be set at logic 0 and 204 will be set at logic 1 as is known in the art.

In the static mode, in between read and write operations, the bit lines BTC and BBC are held at a precharge voltage VDD using the PMOS transistors 102 of the precharge circuit 106 shown in FIG. 1. In the static mode the word line (WL0, WL1, ... WLN) pass transistors 214 and 216 shown in FIG. 2 are held closed as the WLC voltage is at logic zero.

To read the data from the cell the WLC voltage is changed to logic 1. The signal of voltage logic 1 on WLC is applied to the gates of the word line pass transistors 214 and 216, which opens the word line pass transistors 214 and 216, so that current can flow through the transistors. In addition to the WLC voltage being set to logic 1, the precharge circuit 106 is closed so that the bit lines BTC and BBC are allowed to float. With the word line pass gate transistors open, one of the bit lines BTC and BBC will discharge depending on which node 202 or 204 is at zero. For example, if the cell is programmed at logic 0 then the BTC bit line will discharge through the NMOS transistor 214 and the cross coupled storage transistor 210, and BBC would remain floating at the VDD level. If the cell was programmed at logic 1 then BBC would discharge through 216 and 212, and BTC would remain at VDD. The switch (SW0, SW1 ... SWM) connected to the cell which is being read will be closed (conductive) and the sense circuitry 104 will read the difference in voltage in the bit lines BTC and BBC to determine whether the data is 1 (one) or 0 (zero).

In the prior art Static Random Access (SRAM) memory architecture 100 as shown in FIG. 1, there are three stages of operation. At stage 1 memory read/write operations require that all bit lines (BT0, BB0, BT1, BB1, ... BTM, BBM) be precharged to logic 1 by the precharge circuitry 106, the precharge circuitry provides PMOS transistors 102, which in the static mode are opened by a PRCHG voltage signal 108 being at logic 0, which is applied to the gates of the PMOS transistors 102. Also all word lines (WL0, WL1 ... WLN) are set to logic 0 before read read/write operation for any cell occurs.

At stage 2 of the memory read/write mode all are of the PMOS transistors 102 are closed (PRCHG voltage 108 is set to logic 1), so that the voltage on the bit lines is allowed to float, instead of being held at VDD. One of the word lines (e.g. WL0) is driven to logic 1 All the 6T (6-transistor)core memory cells (e.g. bit cells N00, N01 ... N0M) coupled to this word line begin to discharge the bit lines (e.g. BT0, BB, BT1, BB1 ... BTM, BBM). The discharge of the bit lines at this stage causes a large active AC power dissipation.

Stage 3 of the memory bit cell read/write operation is selecting one of the switches (SW0, SW1 ... SWM) in the MUX block 103 by setting Y0, Y1 ... or YM to logic 1. As shown in FIG. 1, Y0 is selecting column 1. To write data to a bit cell at this stage requires using a write circuit 104 to program the selected individual bit cell, by applying a voltage differential to bit lines BT0 and BB0. (The write circuitry and sense circuitry is known to one of skill in the art, and shown as block 104 in FIG. 1.) To read data from the bit cell requires amplifying the differential signal between the bit lines BTC and BBC using a sense amplifier and then routing this to an output circuit.

Regardless of which mode is used, whether read or write, a bit line for each column of SRAM memory bit cells of the complete array will be discharged during every read/write operation, and before a new read/write cycle can begin, and the array has to precharged again. This is because the same PRCHG signal is applied to the gates of all of the PMOS transistors 102 of the precharge circuit 106, and all of the bit cells coupled to word line with logic 1 have word line pass transistors (e.g., 214 and 216) which are opened as a result of the word line generating a logic 1 signal. Stated another way, all the bit lines have to precharged again because all have been discharged during the read/write operation.

One problem with this prior approach is that, for each read/write cycle, enough power to precharge and discharge all of the bit line pairs in the array is consumed, while all that is really needed is to program or read information for one bit line pair (e.g. BTC and BBC) during each read or write cycle.

As disclosed in the patent application filed on Apr. 9, 2002, entitled LOW POWER STATIC RAM ARCHITECTURE (U.S. application Ser. No. 10/119,191) which has common inventors to the present application, and is assigned to the National Semiconductor Corporation, the assignee of the present application, one approach to reduce the power consumed during each read write cycle is to implement an 8 bit memory cell where a column select signal can be used in conjunction with the a word select signal to limit the power discharge during each cycle to a particular column. The U.S. application Ser. No. 10/119,191 referred to above is hereby incorporated by reference in its entirety. As further discussed in the pending patent application Ser. No. 10/215,678 filed on Aug. 10, 2002, entitled LOW AC POWER STATIC RAM ARCHITECTURE, and in the pending patent application Ser. No. 10/215,676 filed on Aug. 10, 2002, entitled BIT LINE SHARING AND WORLD LINE LOAD REDUCTION FOR LOW AC POWER SRAM ARCHITECTURE the SRAM architecture can be further modified to decrease power consumption by providing for word line and bit line sharing and by providing for sector selection where sections of the columns of memory cells can be selected for reading and writing. Both the LOW AC POWER STATIC RAM ARCHITECTURE application and the BIT LINE SHARING AND WORLD LINE LOAD REDUCTION FOR LOW AC POWER SRAM ARCHITECTURE application referred to above are hereby incorporated by reference in their entirety.

The invention herein provides further designs which further decrease the power consumption of the SRAM.

SUMMARY

The present invention is directed to a static RAM system which allows for significant reduction in power consumption over prior systems by providing for partitioning columns of bit cells. One embodiment includes a plurality of columns of bit cells, wherein the columns of bit cells are partitioned into a plurality of sectors of bit cells. This embodiment provides a number of sector select circuits, where local bit lines couple sectors of bit cells with sector select circuits. The embodiment also provides a number of global bit lines which are coupled to the sector select circuits. The sector select circuits include a switch which couples the local bit line with the global bit line so that a selected bit cell in the sector of bit cells can be read from, or written to.

Another embodiment provides a sector select circuit for use in a SRAM system having a plurality of local bit lines and a plurality of global bit lines. The sector select circuit includes a mux circuit for coupling a local bit line of the SRAM with a global bit line of the SRAM system, and a first input for receiving a column select signal form the SRAM system. The sector select circuit also includes a second input for receiving a sector select signal from the SRAM system, and a local column select signal generation circuit which generates a local column select signal in response to receiving a sector select signal and column select signal. The mux circuit is coupled to the local column select signal circuit, and in response to a local column select signal, the mux couples the local bit with the with the global bit line.

Another embodiment provides a SRAM system having an array of bit cells including columns and rows of bit cells, wherein the columns of bit cells are partitioned into sectors of bit cells, and form an array of columns and rows of sectors of bits cells. Bit cells of the sectors of bit cells are coupled to a local bit line. An array of sector selection circuits including columns and rows of sector selection circuits are coupled to the sectors of bit cells, wherein a sector selection circuit is coupled to the local bit line coupled to bit cells of the sector of bit cells. The system also provides for column select lines which are coupled to a column of sector selection circuits, and sector selection lines, which are coupled rows of sector selection circuits. The system also provides global bit lines coupled to the column of sector selection circuits. The sector selection circuits include a first circuit and a switch, wherein the first circuit detects when a sector selection signal is present on the sector selection line and when a column selection signal is present on the column selection line and when both signals are present closes the switch whereby a local bit line to be coupled with a global bit line.

The features and advantages of the present invention will be more fully appreciated upon consideration of the following detailed description of the invention and the accompanying drawings, which set forth an illustrative embodiment in which the principles of the invention are utilized.

BRIEF DESCRIPTION OF THE DRAWINGS

FIGS. 4a–d are illustrations describing SRAM bit cells used in an embodiment of the present invention.

FIGS. 5a–c are views of embodiments of sector select circuits of the present invention.

DETAILED DESCRIPTION OF THE INVENTION

Figures 3, 3A:
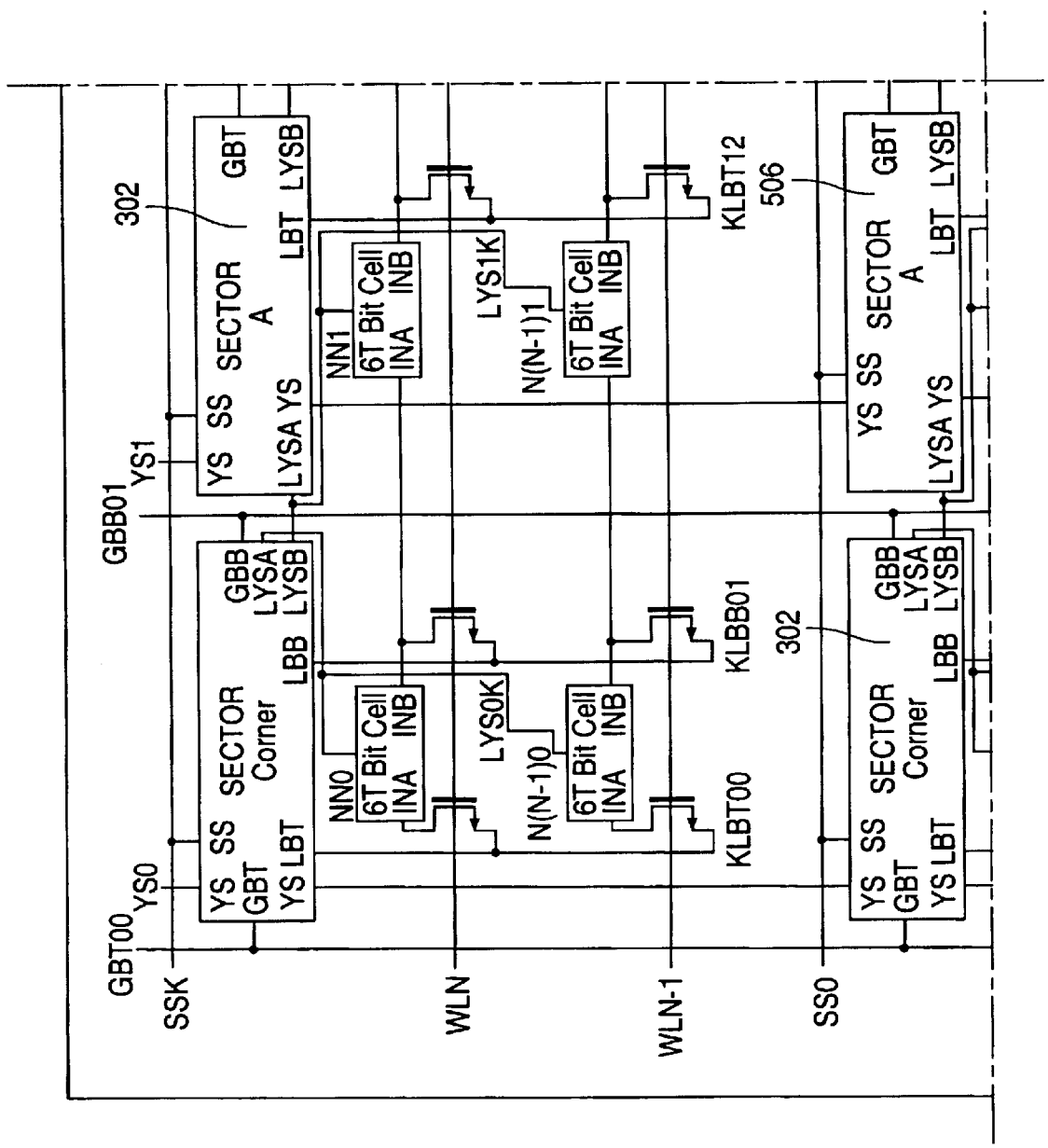
FIG. 3 is a view of the SRAM memory system of the present invention.
Figure 3B:
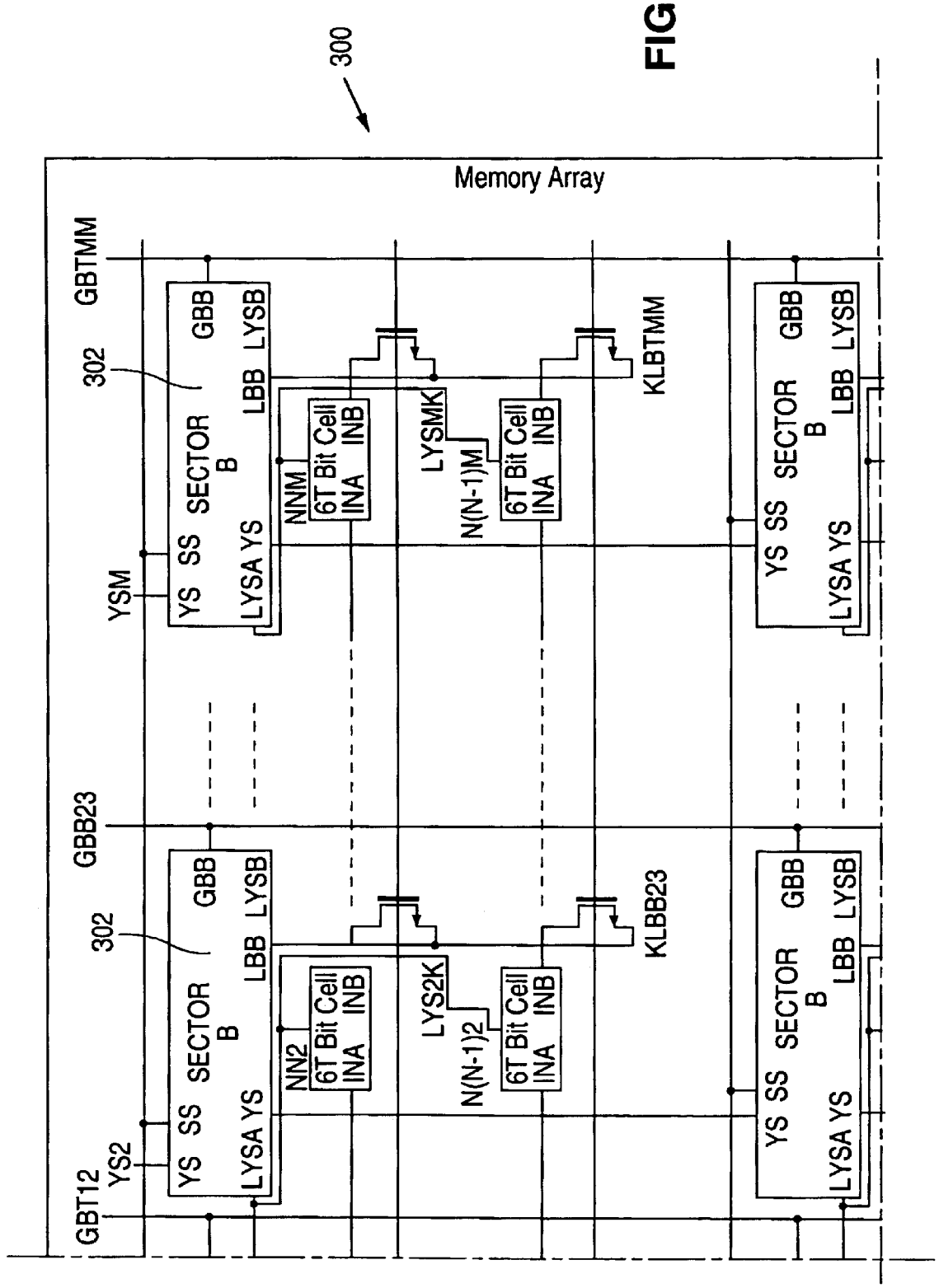
Figure 3C:
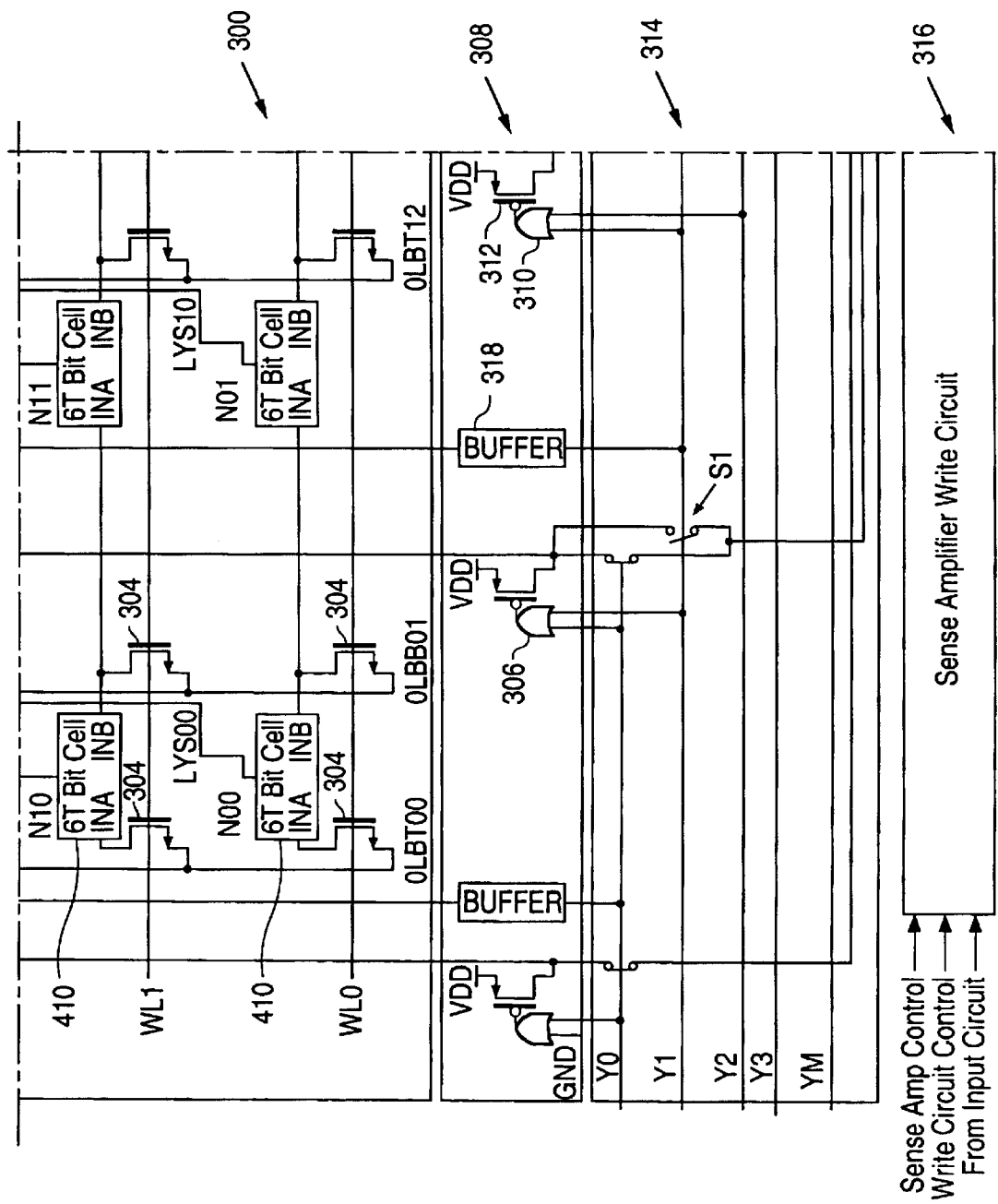
Figure 3D:
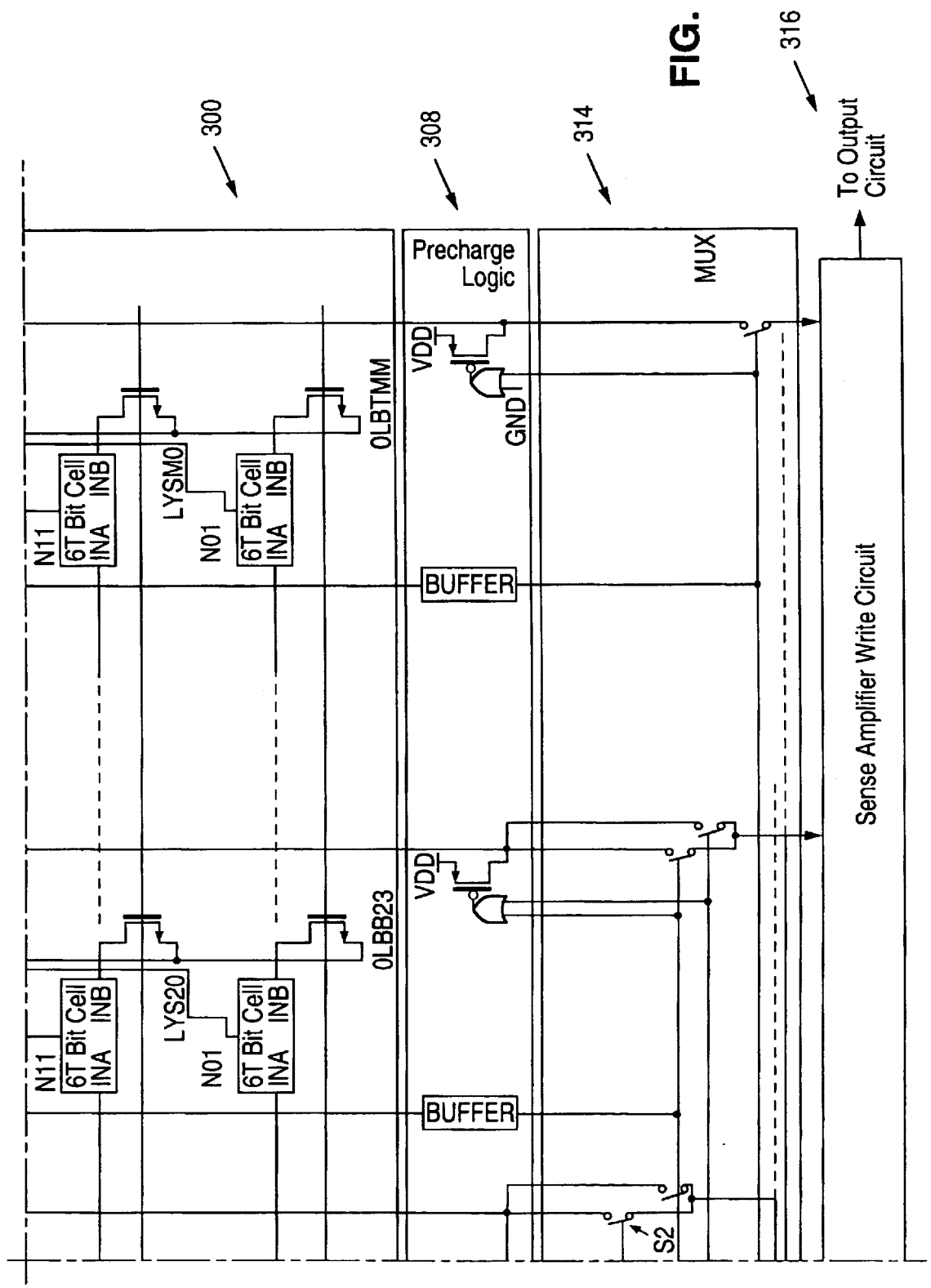

FIG. 3 shows an embodiment of the present invention. The SRAM architecture shown in FIG. 3 includes word lines (WL0, WL1 . . . WLN-1, and WLN) and an array, including columns and rows, of bit cells 410. As shown in FIG. 3, and as discussed in more detail below, the 6T bit cells 410 share local bit lines and share word line pass gate transistors 304.

Figure 4A:
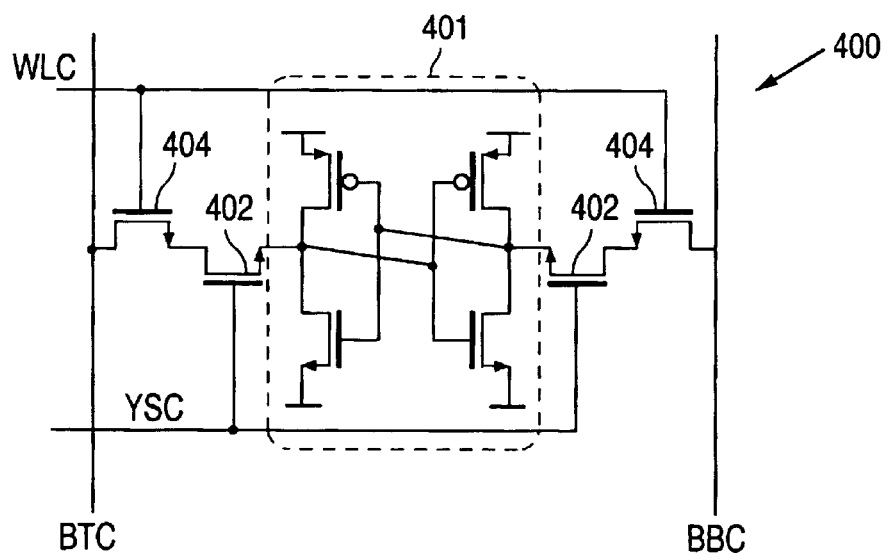
Figure 4B:
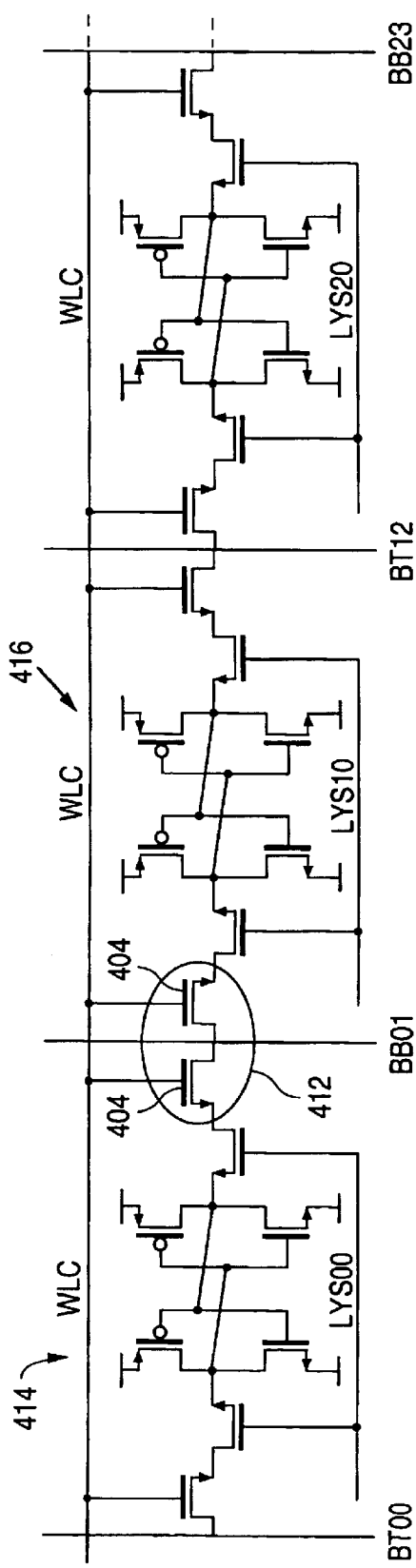

FIGS. 4a–4d show the relationship between an 8 transistor bit memory cell 400 (as described in the above referenced U.S. application Ser. No. 10/119,191) and the 6T bit cell 410 with bit line sharing and word line sharing as shown in FIG. 3. Specifically, FIG. 4a shows a four transistor configuration 401 used for storing a bit of information. To perform a write or read operation to, or from, the four transistor configuration 401 the column select transistors 402 must be opened by providing a column select signal on line YSC, and the word line pass gate transistors 404 must also be opened by providing a signal on the word line WLC. Once the word line pass gate transistors 404 and column select transistors 402 are opened the four transistor configuration 401 can be read from, or written to, by either sensing or applying a voltage across the bit lines BTC and BBC. FIG. 4b shows a configuration where adjacent 8 transistor bit memory cells 400 share bit lines. Specifically area 412 shows the word line pass gate transistors 404 as both being coupled to the bit line BB01 which is shared by the eight transistor bit cells 414 and 416.

Figure 4C:
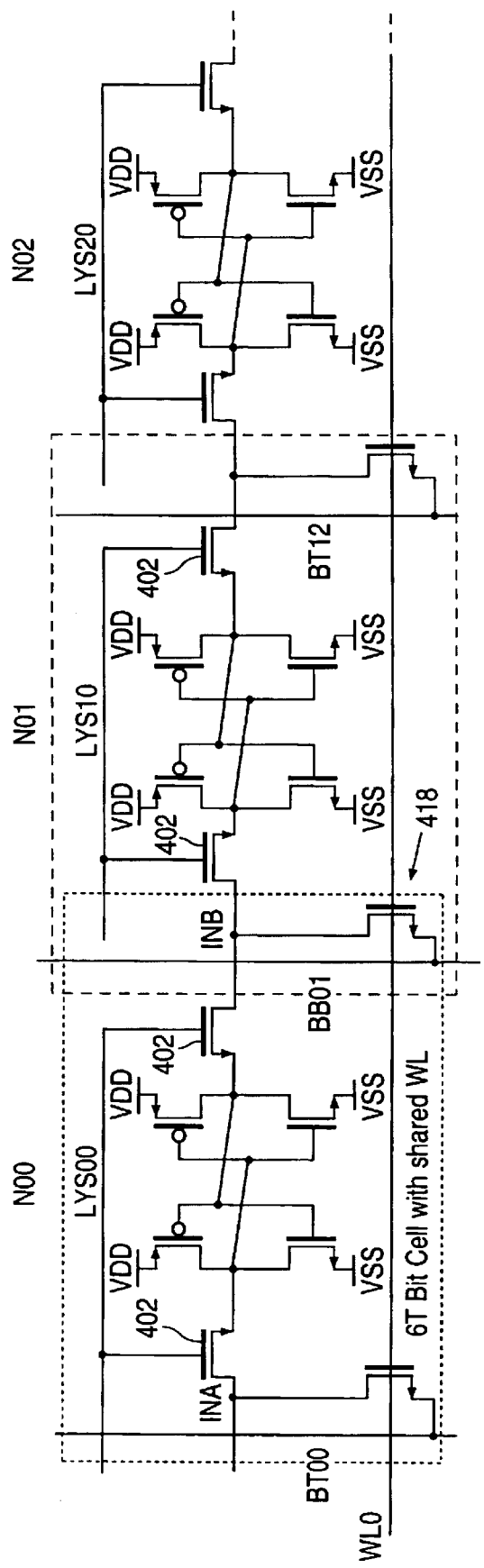
Figure 6A:
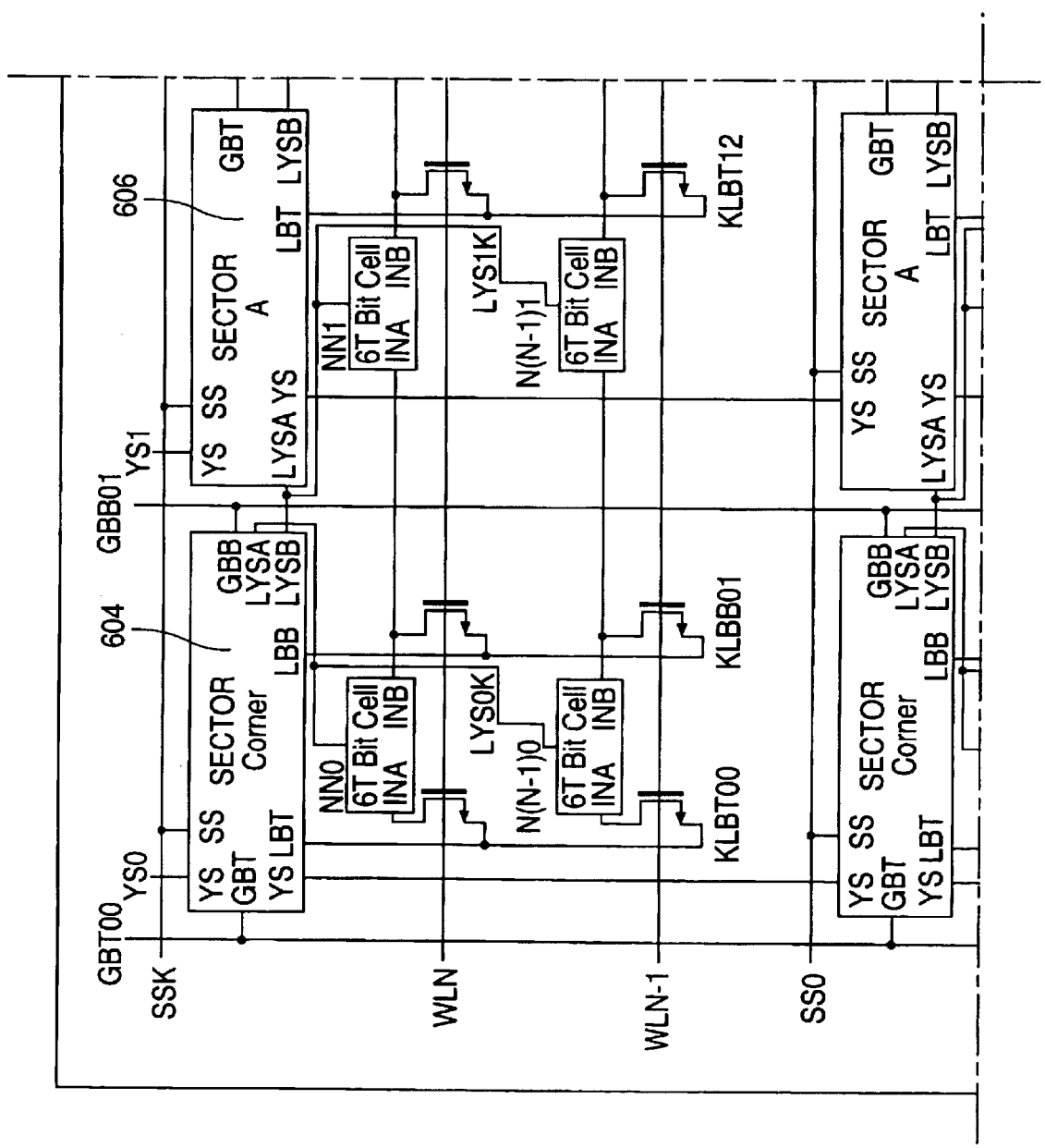
FIG. 6 is a view of an embodiment of an SRAM memory system of the present invention.
Figure 6B:
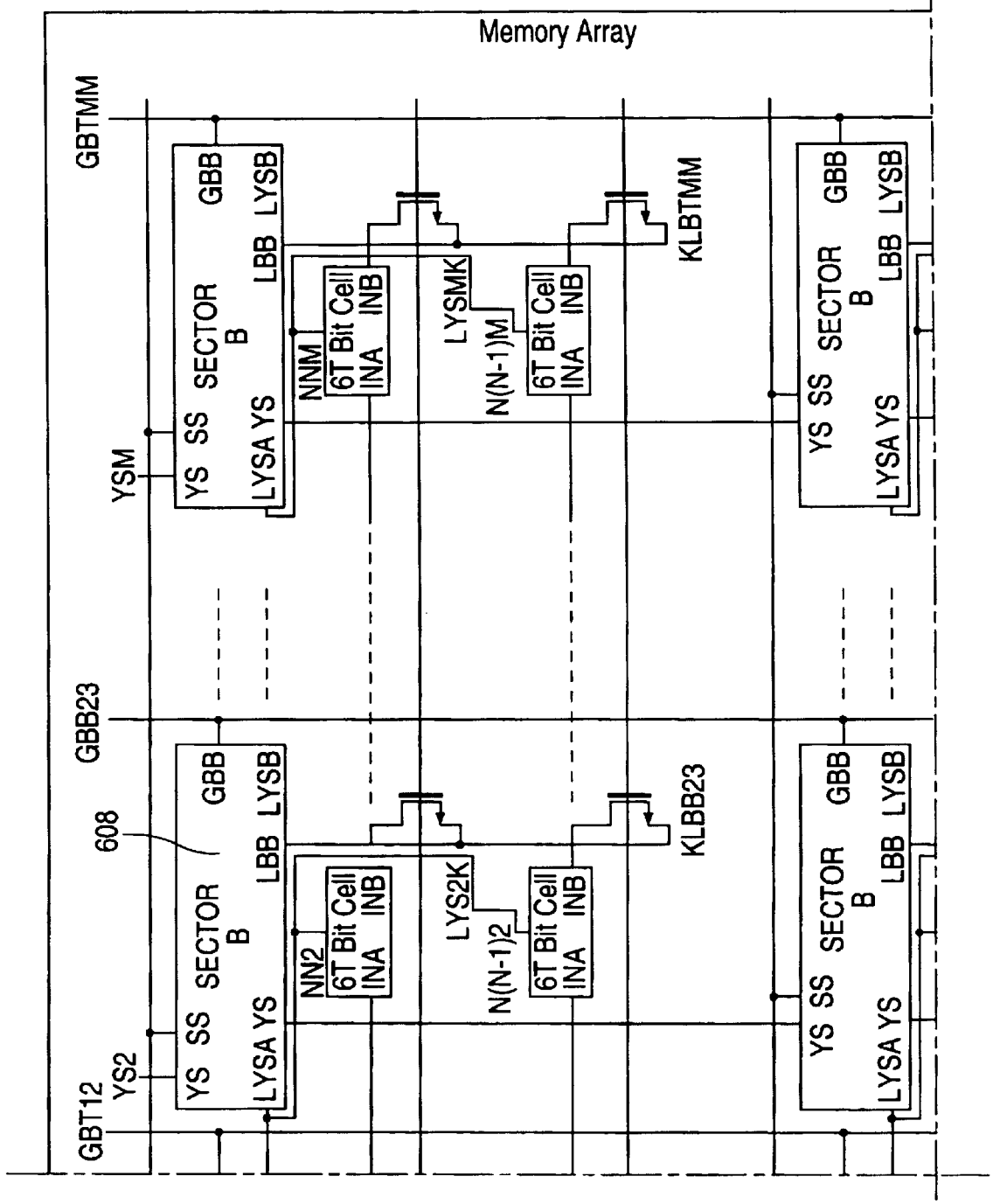
Figure 6C:
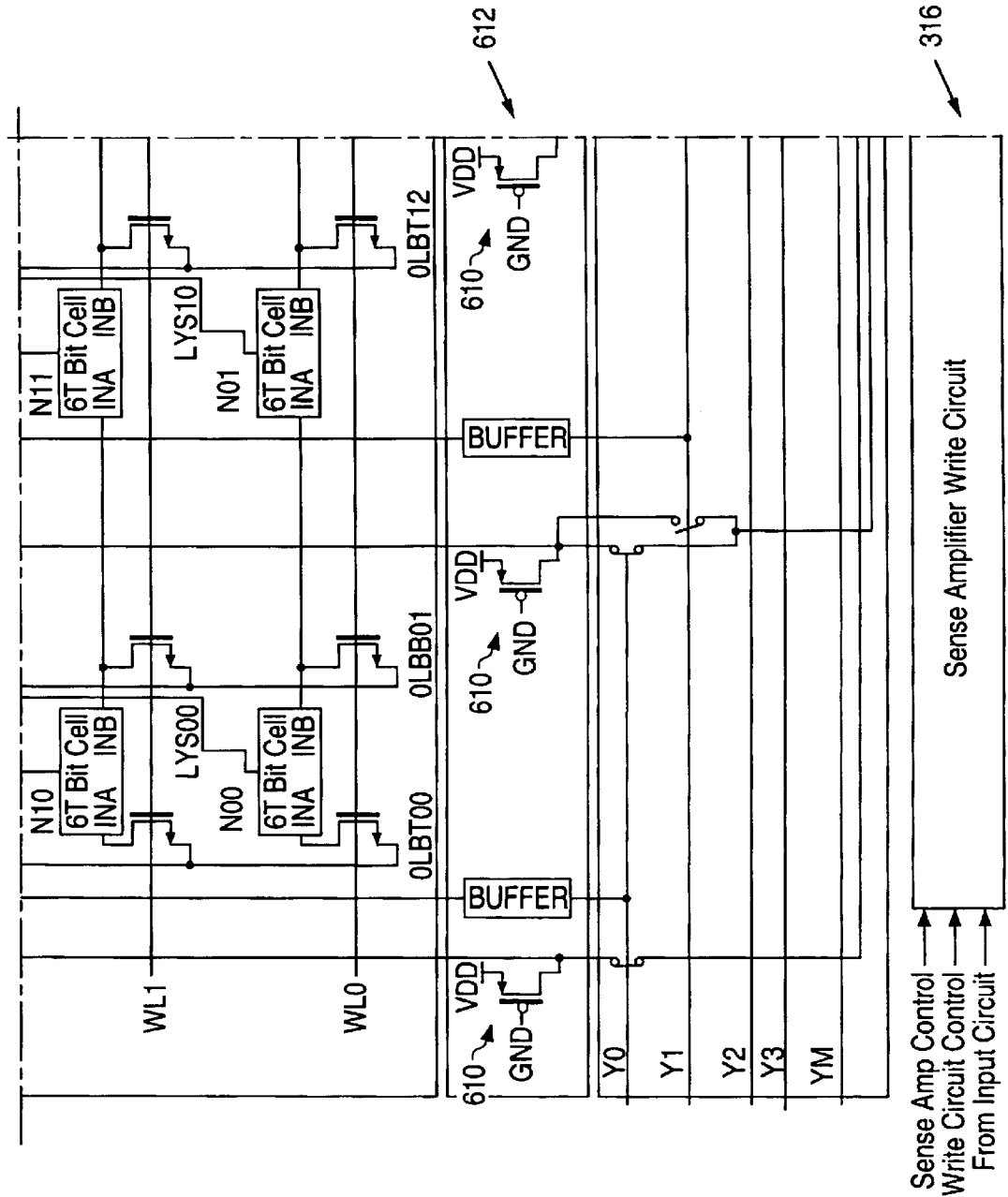
Figure 6D:
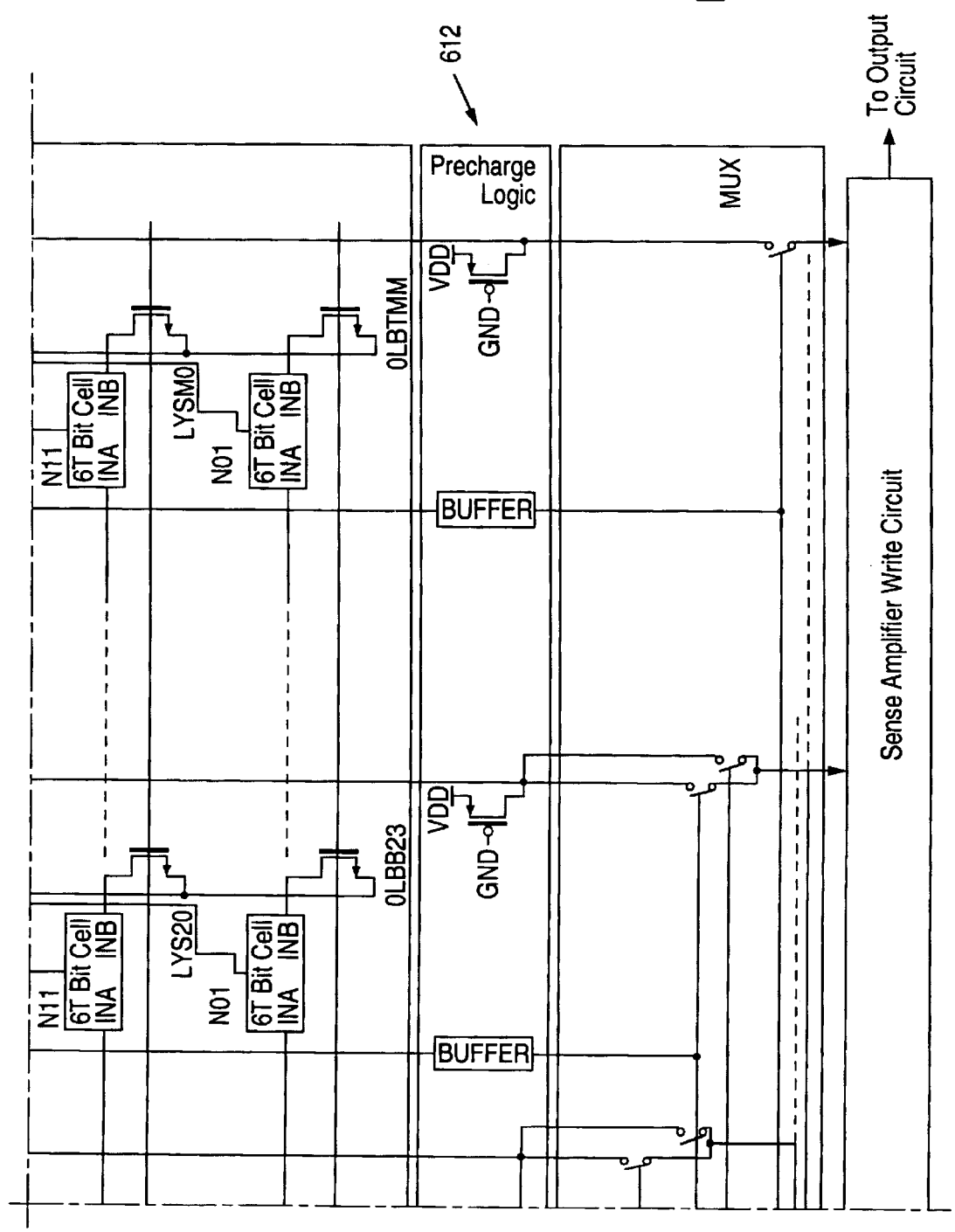
Figures 7A, 7B, 7C:
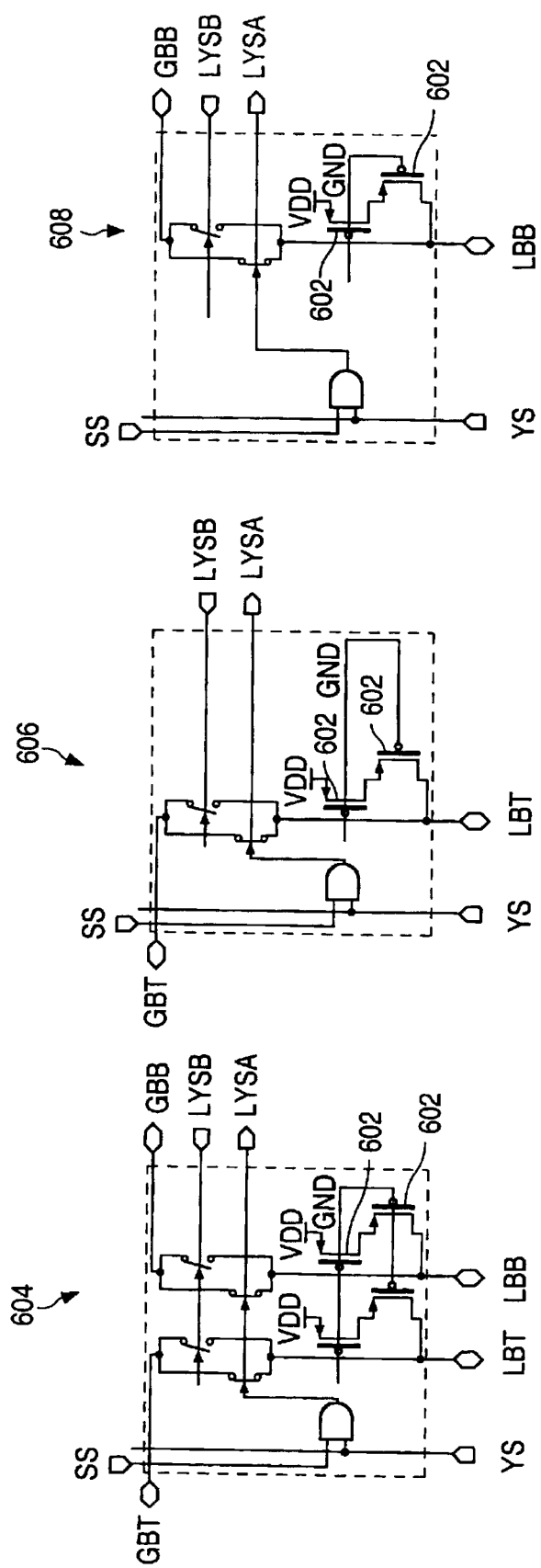
FIGS. 7a–c are views of embodiments of sector select circuits of the present invention.

FIG. 4c shows a cell where the column select pass gate transistors 402 are coupled to a shared word line pass gate transistor 418, which is in turn coupled to the shared bit line BB01. This configuration allows the overall number of word line pass gate transistors to be reduced by 50%. FIG. 4d represents the configuration of the four transistors 401 and the column select transistors 402, as shown in FIG. 4c, by showing a box corresponding to the "6T bit cell" 410. FIG. 4d also shows the shared bit lines are BT00, BB01 and BT12 and the shared word line gate pass transistors 418.

Turning now back to FIG. 3, the SRAM architecture 300, shows an embodiment of the present invention with shared word line pass gate transistors 304, and with shared local bit lines (e.g. 0LBB01, KLBB01 . . . KLBTMM) between adjacent 6T bit cells 410, combined with bit line partitioning to further reduce power consumption and total capacitive load associated with each read/write operation. The overall power saving ratio depends on the sector size relative to the total memory size.

In the SRAM architecture 300, the column select signals YS are sectorized, or partitioned, into local column select signals LYSA. This partitioning of the column select line YS allows for further load reduction, where the load reduction depends on the ratio of the sector size over the total memory size.

Figure 1:
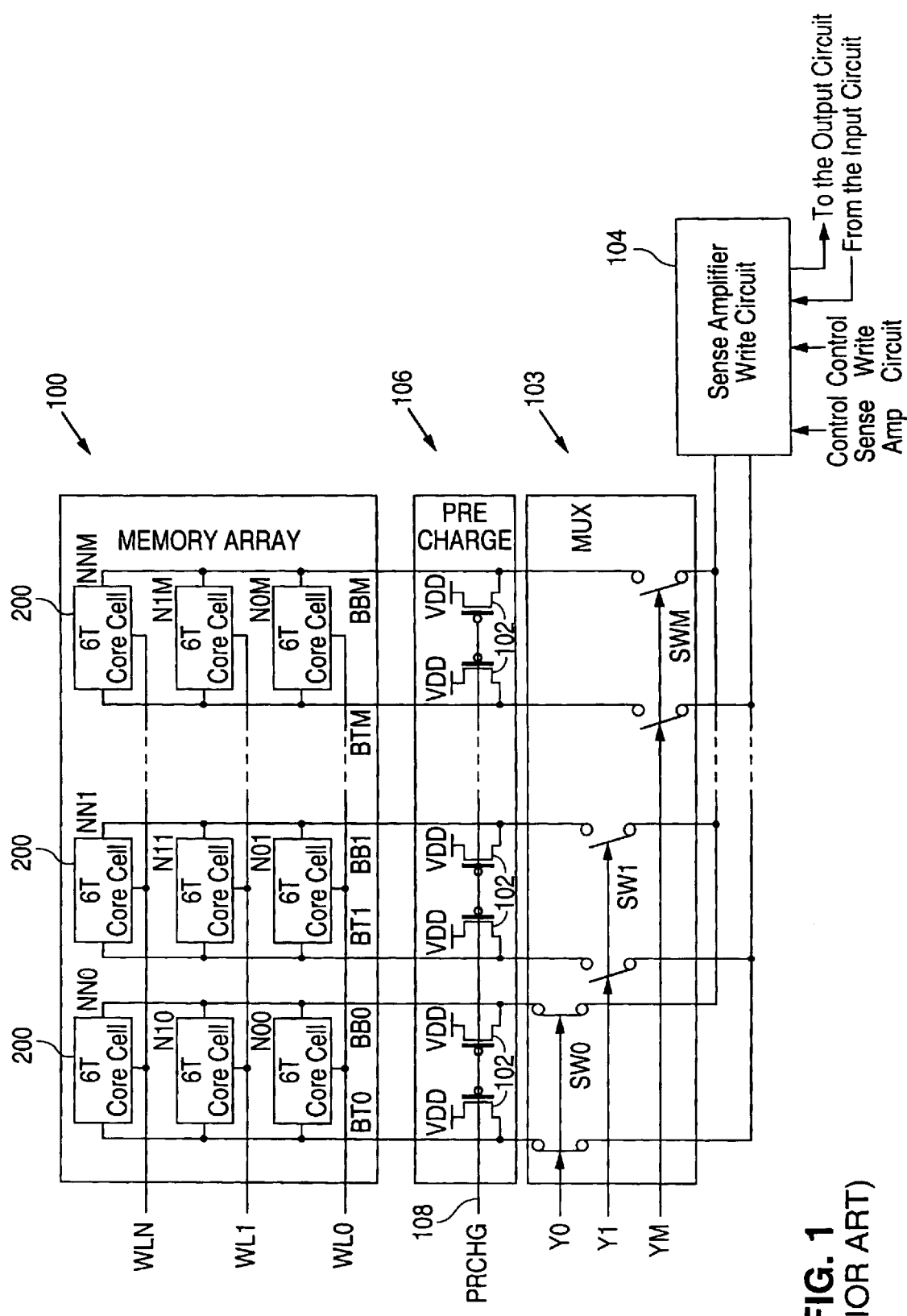
FIG. 1 is a view of an SRAM system of the prior art.
Figure 2:
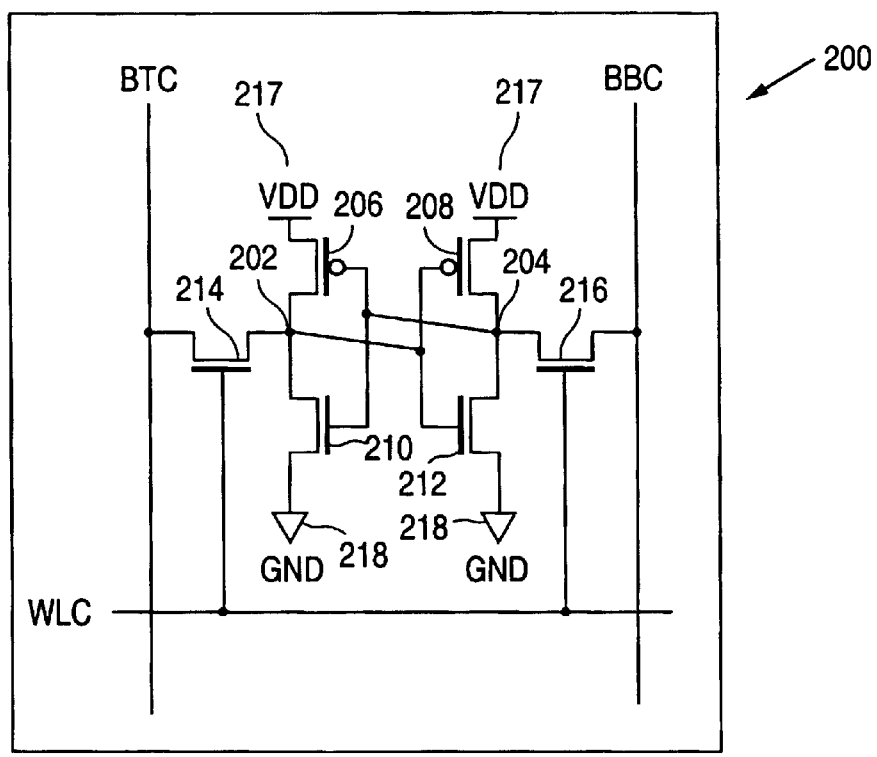
FIG. 2 is a view of an SRAM bit cell of the prior art.

As shown in FIG. 3 the bit lines are partitioned into sections of local bit lines which correspond to the partitioning of the column select lines. Specifically, each bit line is partitioned into K sectors. Thus, instead of having bit lines BB00 and BT01 for column 0, as shown in FIG. 1, there are local bit lines 0LBT00 and 0LBB01 for section 1, 1LBT00 and 1LBT01 for section 2 and so forth, where the local bit lines are partitioned as 01BT00, 0LBB01, 1LBT00, 1LBB01, KLBBMM, KLBTMM for K sectors and M columns. During each read/write operation, only one sector is activated, and the local column select signal is present on only one LYSA line, where the LYSA line with the local column select signal is coupled to the 6T bit cells in the sector which contains the 6t bit cell which is being written to, or read from.

Each sector of the memory array of bit cells includes a sector selection circuit 302. As discussed in more detail below, the operation and principles of different sector selection circuits, in the SRAM architecture is essentially identical, but some modifications are necessary to account for the sector selection circuits position in the overall array of 6T bit cells 410.

As shown in FIGS. 5a–5c, the sector selection circuit includes a column mux circuit 502, and a precharge circuit 504. The sector selection circuit also includes an AND gate 508, which operates as a circuit for receiving a sector select signal (SS) and for receiving a column select signal YS. The sector select signal is received at input port 510, and the column select signal is received at input port 512. The precharge circuit 504 of the sector select circuit 302 serves to precharge local bit lines LBB and LBT to the voltage VDD. The mux 502 serves to couple the selected local bit lines LBT and LBB with the corresponding global bit lines GBT and GBB.

Because the local bit lines LBT and LBB are shared between adjacent 6T bit cells 410, the precharge circuit 504 is shared between adjacent sectors of adjacent columns of bit cells 410. One exception to this is noted in connection with the bit line 0LBT00 of column 0 at the left hand side of the SRAM architecture shown in FIG. 3. For the sector select circuit in the far left hand column, the "sector corner" circuit, one additional precharge 504 and mux 502 circuit is provided (detail for the "sector corner" circuit is shown in FIG. 5a). The shared global bit lines are GBT00 and GBB01 for column 0, GBB01 and GBT12 for column 1 and so forth. The bit lines BT and BB alternate every other column as shown in FIG. 3. Hence the "sector A" selection circuitry, shown in FIG. 5b, and the "sector B" selection circuitry, shown in FIG. 5c alternate, every other column like the bit lines.

The local bit lines LBT and LBB can be accessed for reading or writing to a selected 6T bit cell 410 through the global bit lines GBT and GBB, where the selected mux switches 502 are opened to connect a specific global bit line with a selected pair of local bit lines, and the word lines (e.g. WL0, WL1 . . . ) and the local column select signals, LYSA, are utilized to select a specific 6T bit cell for reading or writing. In one embodiment the transmission gates 502 are implemented using NMOS transistors. The switches 502 are controlled by the local column select signals LYSA.

Further details of the SRAM architecture can be illustrated by example. Consider for instance, the situation where 6T bit cell N01 is being read from. In this situation a column select signal voltage is generated on column select line Y1. This voltage on line Y1 is received by the NOR gate 306, of the global bit line precharge circuit 308. The NOR gate 306 then outputs a voltage which causes the PMOS transistor 308, which is coupled to the global bit line GBB01, to close, and thus GBB01 is allowed to float. Further, the NOR gate 310 receives the voltage on Y1 and in response outputs a voltage which closes the PMOS transistor 312 which allows the global bit line GBT12 to float. The column select signal Y1 is also transmitted through the buffer 318 as signal YS to the sector select circuits in column 1. (As shown these are "sector A" circuits.) The sector select circuit in column 1 corresponds to the sector select circuit 506 shown in FIG. 5b. The column signal YS is received by the AND gate 508. A sector select signal is also generated sector select line SS0. The sector select signal SS0 is also received by the AND gate 508. In response to receiving the signals on sector select line and the column select line the AND gate 508 outputs a local column select signal LYSA, on the local column select line LYSA. This local column select signal closes (makes conductive) a switch of the mux 502 thereby coupling the local bit line LBT with the global bit line GBT. Additionally, the voltage output by the AND gate, LYSA, is applied to the gate of the one of the PMOS transistors of the precharge circuit 504 which causes one of the transistors to close and thus the local bit line LBT of sector 1 of column 1 is allowed to float. Note that the "sector A" circuit 520 is the only sector select circuit of the SRAM architecture 300 which receives a sector select signal and a column select signal, and hence it is the only sector select circuit which outputs a local column select signal LYSA.

The signal LYSA output by the AND gate 508 is also output to the 6T bit cells 410 of the first sector of column 1 on a local column select line LYSA. This LYSA signal is received by the column select pass gate transistors 402 (see FIG. 4c) of the 6T bit cells 410, and in response the column select pass gate transistor open. A signal is also generated on the word line WL0 and in response to this signal the word line pass gate transistors 304 (as shown in FIG. 3) coupled to the WL0 word line open.

In addition to outputting a signal LYSA in response to the sector select signal SS0 and the column select YS signal, the sector select circuit also outputs a line select signal LYSB. The LYSB signal is input to the line select signal input port LYSB for sector select circuit shown as "Sector Corner" 302 in FIG. 3. This sector select circuit is shown in detail in FIG. 5a. The line select signal LYSB causes a PMOS transistor of the precharge circuit 504 of the sector selection circuit which receives it to close which allows the local bit line LBB01 to float. The signal LYSB also closes a switch in the mux 502 of the Sector Corner 302 circuit, which couples the local bit line LBB01 with the global bit line GBB01.

Reference is now made to the SRAM mux circuit 314, where in response to the signal on Y1 switches S1 and S2 of the mux 314 are closed, and thereby couples the global bit lines GBB01 and GBT12 with the sense amplifier write circuit 316. The sense amplifier write circuit operates to sense a voltage differential between the global bit lines GBB01 and GBT12 thereby reading data stored in the bit cell 410 shown as N01. To write data to the N01 the sense amplifier write circuit applies a voltage differential between the bit cells GBB01 and GBT12.

In the manner described above data can be written to read from any of the bit cells (N00–NNM). By way of a hi-level summary example to read information at bit cell N00, the YS0 and SS0 are turned on. The corresponding precharge circuits are turned off and the switches are closed to couple the local bit lines with the global bit lines. The differential signal at 0LBB01 and 0LBT00 will be passed to the global bit line GBB01 and GBT00 respectively.

The load reduction ratio depends on the number of sectors in memory. For example, in a 256×256 memory with 16 sectors, each sector will contain 16 bit cells vertically. The load for the local bit line will be the 16 bit cells in the sector. Transistors in the sector will be the total load for the global bit line. If the load of the sector mux is similar to the load for a bit cell, then the load for the global bit line equals the load of the 16 bit cells. Therefore, the load can be reduced from 256 to 32. In addition sector select circuitry which generates the sector select signal may also create an additional load. In one embodiment the load of the sector select circuit is equivalent to 16 bit cells, so the total load reduction is from 256 to 48.

It should be noted that the invention has been described above in connection with a synchronous SRAM where the precharge circuit is turned on and off in connection.,with reading and writing information to the bit cell. The invention herein can also be applied to an asynchronous SRAM where the precharge circuits are not clocked on and off, and are instead always held in an on state. FIG. 6 shows an asynchronous SRAM system 600. In this asynchronous system 600, the gates of the PMOS transistors 602 of the precharge circuits 608 sector select circuits 604, 606 and 608 are connected to ground. Further, the gates of the PMOS transistors 610 of the global bit line precharge circuit 612 are connected to ground. This means the local bit lines (0LBT00–KLBTMM) and the global bit lines (GBT00–GBTMM) are in a state of constant precharge. In prior asynchronous SRAM (similar to the system shown in FIG. 1, but with the PMOS transistors 102 held in an open condition) large power consumption occurred because the there is a short circuit path between Vdd and ground through the PMOS precharge transistors 602 and through the bit cells for both the selected columns and the non-selected columns. As discussed in more detail in patent application Ser. No. 10/119,191 this large power consumption has limited the actual use of asynchronous SRAM systems. By employing the asynchronous system shown in FIG. 6, there is a significant reduction in power consumption. This reduction in AC power dissipation for asynchronous memories is realized by partitioning columns of bit cells into sectors as described above. Reduced power consumption within the memory is achieved due to the proportional reduction of the short circuit current between Vdd and Gnd as only the one selected sector of bit cells consumes power, while the rest of the unselected sectors will be inactive and remain in the precharged state. This technique also reduces the peak AC current by the same argument.

For example, to read information at bit cell N00, the YS0 and SS0 are turned on, and the switches of the mux of corresponding sector selection circuit are closed to couple the local bit lines with the global bit lines. The corresponding word line WL0 is also turned on, and the differential signal at 0LBB01 and 0LBT00 will be passed to the global bit line GBB01 and GBT00 respectively. Thus, the present a SRAM asynchronous system as shown in FIG. 6 reduces the amount of power consumed during read and write operations, as only the local bit lines discharged are 0LBB01 and 0LBT00. Additionally aspects of asynchronous SRAM systems are discussed in patent application Ser. No. 10/119, 191.

Although specific embodiments and methods of the present invention are shown and described herein, this invention is not to be limited by these methods and embodiments. Rather, the scope of the invention is to be defined by the following claims and their equivalents.

What is claimed is:

1. A SRAM memory system for storing data, including:
   a plurality of columns of bit cells, wherein the columns of bit cells are partitioned into a plurality of sectors of bit cells;
   a plurality of sector select circuits;
   a plurality of local bit lines, wherein a sector of bit cells is coupled to a sector select circuit by a local bit line;
   a plurality of global bit lines, wherein a global bit line is coupled to the sector select circuit; and
   wherein the sector select circuit includes a switch which couples the local bit line with the global bit line so that a selected bit cell in the sector of bit cells can be read from, or written to.

2. The SRAM memory system of claim 1, wherein the sector select circuit includes an input for receiving a column select signal, and an input for receiving a sector select signal, and includes a circuit for generating a local column select signal based on a received column select signal and a received sector select signal.

3. The SRAM memory system of claim 1, further including a local column select line coupling the sector select circuit with the sector of bit cells, such that each bit cell of the of the sector of bit cells receives a local column select signal generated by the sector select circuit.

4. The SRAM memory system of claim 1, wherein the sector select circuit includes an input for receiving a column select signal, and an input for receiving a sector select signal, and includes a circuit for generating a local column select signal based on a received column select signal and a received sector select signal, and the SRAM memory system further includes a local column select line coupling the sector select circuit with the sector of bit cells, such that each bit cell of the of the sector of bit cells receives the local column select signal.

5. The SRAM system of claim 4, further including:
   a plurality of word line pass gate transistors, wherein a word line pass transistor is coupled to a bit cell of the sector of bit cells;
   a plurality of word lines wherein a word line is coupled to a word line pass gate transistor;
   wherein a bit cell of the sector of bit cells include a column select pass gate transistor;
   wherein the local column select line is coupled to the column select pass gate transistor of the bit cell, such that when a local column select signal is present on the local column select line the column select pass gate transistor is open, and wherein a when signal is present on the word line the word line pass gate transistor is open, and wherein when both the word line pass gate transistor and the column select pass gate transistor are open data can be read from or written to the bit cell.

6. The SRAM system of claim 1, wherein the sector select circuit includes a precharge circuit coupled to the local bit line, wherein the precharge circuit precharges the local bit line.

7. A sector select circuit for use in a SRAM system having a plurality of local bit lines and a plurality of global bit lines, the sector select circuit, including:

a mux circuit for coupling a local bit line of the SRAM with a global bit line of the SRAM system;

a first input for receiving a column select signal form the SRAM system;

a second input for receiving a sector select signal from the SRAM system;

a local column select signal circuit which generates a local column select signal in response to receiving a sector select signal and a column select signal, wherein the mux circuit is coupled to the local column select signal circuit, and in response to a local column select signal, the mux couples the local bit with the with the global bit line.

8. The sector select circuit of claim 7, further including an AND gate which receives a select signal from the first input and an sector select signal from the second input, and when both of these signals are present outputs a signal to the mux circuit which causes the mux to couple the local bit line with the global bit line.

9. The sector select circuit of claim 7, further including an input for receiving a it line select signal from an adjacent sector select circuit, the mux circuit is coupled to the input for receiving the line select signal such that in response to the line select signal the mux couples the local bit line with the global bit line.

10. The sector select circuit of claim 7, wherein the mux includes an NMOS transistor which is coupled to the local column select signal circuit such that the NMOS transistor opens, in response to a local column select signal, whereby the local bit line is coupled to the global bit line when the NMOS transistor is open.

11. The sector select circuit of claim 7, further including a precharge circuit for precharging the local bit line.

12. The sector select circuit of claim 11, wherein the precharge circuit includes a first transistor which is coupled to local column select signal circuit such that in response to a local column select signal, the first transistor is closed, whereby when the transistor is closed the precharge circuit does not apply a precharge voltage to the local bit line.

13. The sector select circuit of claim 12, further including an input for receiving a line select signal from an adjacent sector select circuit, wherein the precharge circuit includes a second transistor which is coupled to the select signal from the adjacent sector select signal such that in response to the a line select signal the second transistor is closed, whereby when the second transistor is closed the precharge circuit does not apply a precharge voltage to the local bit line.

14. A SRAM system for storing data including:

an array of bit cells including columns and rows of bit cells;

wherein the columns of bit cells are partitioned into sectors of bit cells, and form an array of columns and rows of sectors of bits cells;

a plurality of local bit lines, wherein bit cells of a sector of bit cells are coupled to a local bit line;

an array of sector selection circuits including columns and rows of sector selection circuits wherein the array of sector selection circuits corresponds the array of columns and rows of sectors of bit cells, and wherein a sector selection circuit is coupled to the local bit line coupled to bit cells of the sector of bit cells;

a plurality of column select lines, wherein a column select line is coupled to a column of sector selection circuits;

a plurality of sector selection lines, wherein a sector selection line is coupled to a row of sector selection circuits;

a plurality of global bit lines, wherein a global bit line is coupled to the column of sector selection circuits; and wherein a sector selection circuit includes a first circuit and a switch, wherein the first circuit detects when a sector selection signal is present on the sector selection line and when a column selection signal is present on the column selection line and when both signals are present closes the switch whereby a local bit line is coupled with a global bit line.

15. The SRAM system of claim 14, further including:

a plurality of local column select lines, wherein the sector select circuit is coupled to the sector of bit cells by a local column select line;

wherein the bit cells in the sectors of bit cells include a column select pass gate transistor;

wherein when the first circuit of the sector selection circuit detects a sector selection signal and a column selection signal, the first circuit transmits a local column select signal on the local column select line which causes the column select pass gate transistor to open.

16. The SRAM system of claim 15, wherein the fist circuit includes and AND gate which outputs the local column select signal when the sector select signal and column select signal are present.

17. The SRAM system of claim 16, further including:

a plurality of rows of word line pass gate transistors, wherein a wordline pass gate transistor is coupled to a local bit line and a bit cell;

a plurality of word lines, wherein a word line is coupled to a row of word line pass gate transistors, such that when a signal is present on the word line, word line pass gate transistors of the row of word line pass gate transistors are opened.

18. The SRAM system of claim 14, wherein a first column of sectors of bit cells, and a second column of sectors of bits cells share a local bit line.

* * * * *

UNITED STATES PATENT AND TRADEMARK OFFICE
CERTIFICATE OF CORRECTION

PATENT NO. : 6,711,051 B1
DATED : March 23, 2004
INVENTOR(S) : Pavel Poplevine et al.

It is certified that error appears in the above-identified patent and that said Letters Patent is hereby corrected as shown below:

Column 8,
Lines 34-35, delete "of the".
Line 45, delete "of the".
Line 59, delete "a" after "wherein" and insert -- a -- before the word "signal".

Column 9,
Line 6, delete "form" and insert -- from --.
Line 16, delete "with the".
Line 20, delete "an" and insert -- a --.
Line 25, delete "it" and insert -- bit --.

Column 10,
Line 8, insert -- to -- after the word "corresponds".
Line 37, delete "fist" and replace with the word -- first --.
Line 38, delete "and" and insert -- an --.
Line 51, delete "bits" and insert -- bit --.

Signed and Sealed this

Second Day of November, 2004

JON W. DUDAS
*Director of the United States Patent and Trademark Office*